(12) United States Patent
Itahashi

(10) Patent No.: US 8,730,361 B2
(45) Date of Patent: May 20, 2014

(54) PHOTOELECTRIC CONVERSION DEVICE AND CAMERA WITH GATE-ELECTRODE COVERING FILM

(75) Inventor: Masatsugu Itahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 414 days.

(21) Appl. No.: 13/091,535

(22) Filed: Apr. 21, 2011

(65) Prior Publication Data

US 2011/0285892 A1  Nov. 24, 2011

(30) Foreign Application Priority Data

May 18, 2010  (JP) .................................. 2010-114706

(51) Int. Cl.
*H01L 27/00* (2006.01)
*H01L 27/088* (2006.01)

(52) U.S. Cl.
USPC .......................................... 348/294; 257/292

(58) Field of Classification Search
USPC .......... 348/294–310; 257/288–294, 440–448; 250/208.1
See application file for complete search history.

(56) References Cited

U.S. PATENT DOCUMENTS

| 6,483,541 | B1  | 11/2002 | Yonemoto et al. | ............. 348/302 |
| 6,930,299 | B2* | 8/2005  | Ohkawa          | ....................... 250/208.1 |
| 7,005,689 | B2* | 2/2006  | Song et al.     | ..................... 257/290 |
| 7,560,678 | B2  | 7/2009  | Ohkawa          | |
| 7,567,277 | B2  | 7/2009  | Inaba et al.    | .................... 348/245 |
| 7,671,437 | B2* | 3/2010  | Rhodes          | .......................... 257/464 |
| 7,767,952 | B2  | 8/2010  | Ohkawa          | |
| 7,920,192 | B2* | 4/2011  | Watanabe et al. | ............. 348/308 |
| 8,383,448 | B2* | 2/2013  | Kao             | ................................. 438/75 |
| 8,501,520 | B2* | 8/2013  | Hirota et al.   | ..................... 438/72 |
| 2002/0027239 | A1* | 3/2002 | Ohkubo | ......................... 257/292 |
| 2004/0080009 | A1* | 4/2004 | Sandhu et al. | ................ 257/437 |
| 2004/0147068 | A1  | 7/2004 | Toyoda et al. | ................ 438/197 |
| 2006/0208289 | A1  | 9/2006 | Ohkawa et al. | .............. 257/291 |
| 2007/0108546 | A1* | 5/2007 | Furuichi | ....................... 257/462 |
| 2007/0158711 | A1  | 7/2007 | Adkisson et al. | ............ 257/292 |
| 2009/0020795 | A1  | 1/2009 | Doi et al. | |
| 2009/0136174 | A1  | 5/2009 | Itahashi | .......................... 385/14 |
| 2010/0079636 | A1* | 4/2010 | Aoki et al. | ..................... 348/294 |
| 2010/0176272 | A1  | 7/2010 | Itahashi | ..................... 250/208.1 |

FOREIGN PATENT DOCUMENTS

| CN | 1719879 A | 1/2006 |
| JP | 2004-165236 A | 6/2004 |
| JP | 2004-228425 A | 8/2004 |
| JP | 2006-261355 A | 9/2006 |
| JP | 2007180336 A | 7/2007 |
| JP | 2009026848 A | 2/2009 |

* cited by examiner

*Primary Examiner* — Twyler Haskins
*Assistant Examiner* — Dwight C Tejano
(74) *Attorney, Agent, or Firm* — Fitzpatrick, Cella, Harper & Scinto

(57) ABSTRACT

A photoelectric conversion device including a pixel region having a photoelectric converter, and a transfer MOS transistor for transferring charges in the photoelectric converter to a floating diffusion, comprises a first insulating film continuously arranged to cover the photoelectric converter, and a first side surface and a first region of an upper surface of a gate electrode of the transfer MOS transistor while not arranged on a second region of the upper surface, the first insulating film being configured to function as an antireflection film, a contact plug connected with the floating diffusion, and a second insulating film continuously arranged to cover a periphery of the contact plug on the floating diffusion, and the second side surface and the second region while not arranged on the first region, the second insulating film being configured to function as an etching stopper in forming the contact plug.

20 Claims, 5 Drawing Sheets

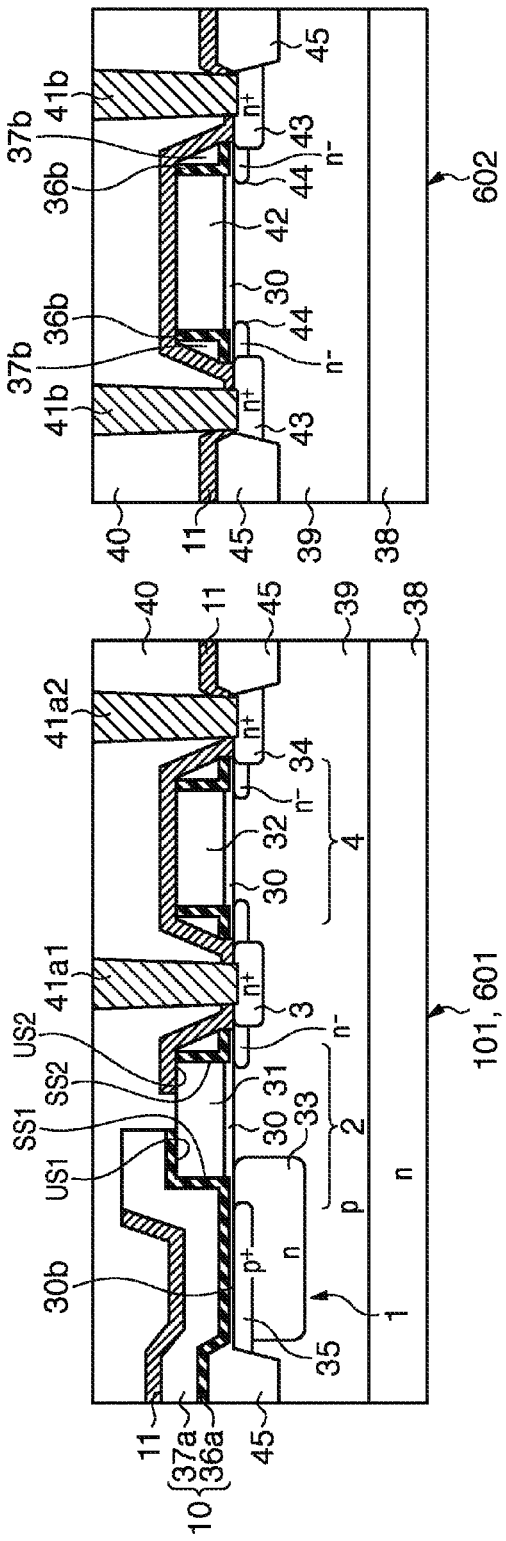

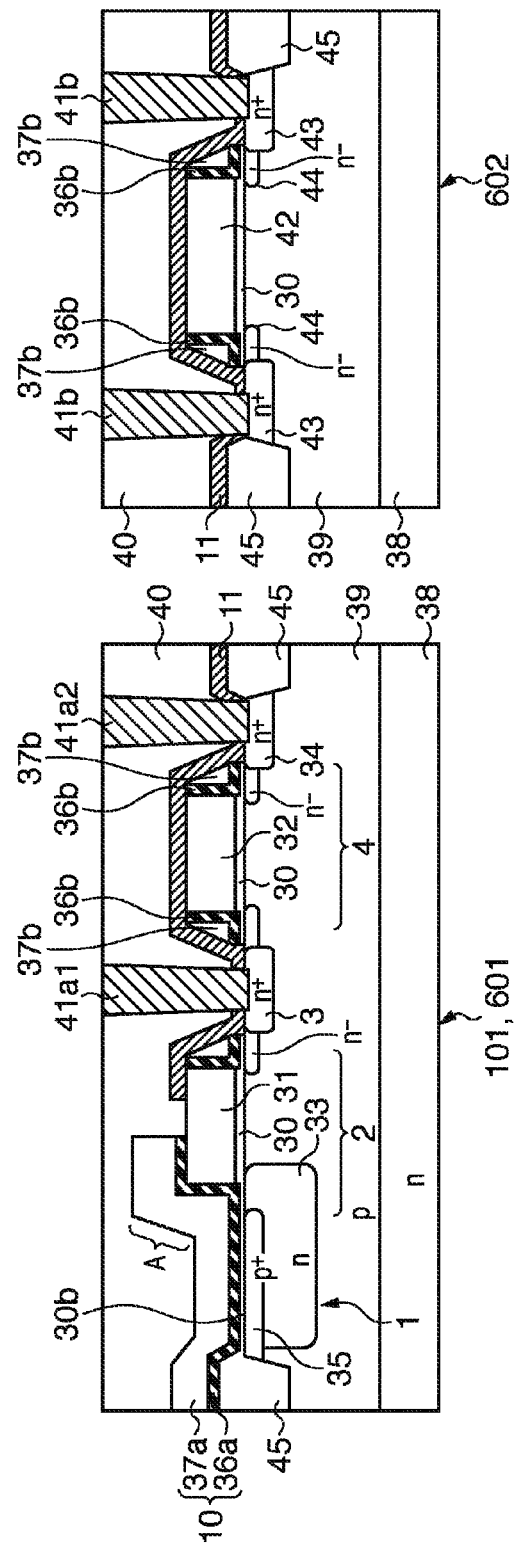

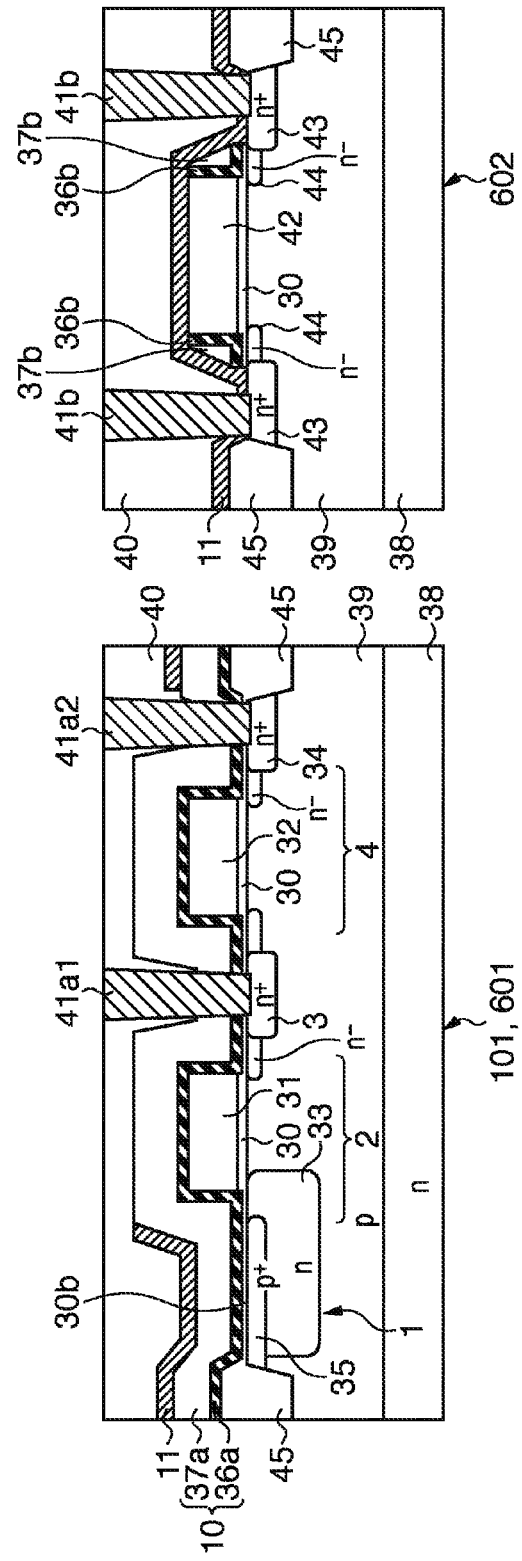

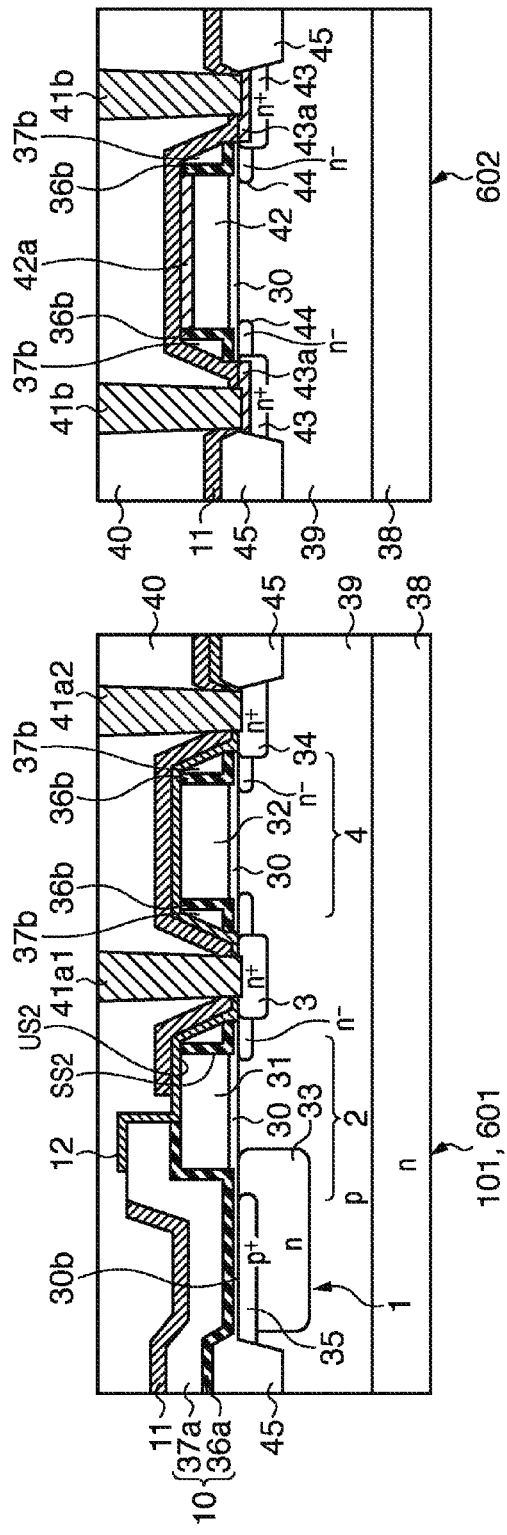

PHOTOELECTRIC CONVERSION DEVICE AND CAMERA WITH GATE-ELECTRODE COVERING FILM

BACKGROUND OF THE INVENTION

1. Field of the Invention

The present invention relates to a photoelectric conversion device and a camera including the same.

2. Description of the Related Art

A CCD- or CMOS-type photoelectric conversion device has been used in many digital still cameras and digital camcorders. In particular, a CMOS-type photoelectric conversion device has the advantage over a CCD-type one in terms of power consumption and multifunctionality, and its application range has recently widened.

A photoelectric conversion device uses a method for improving sensitivity by forming, as an antireflection film, an insulating film with an intermediate refractive index between the refractive indices of a photoelectric converter for converting light into an electric signal and an insulating film arranged thereon.

With an increase in number of pixels, the size of a pixel is smaller. This creates a need to reduce the size of a photoelectric converter in a photoelectric conversion region, and that of a MOS transistor in a photoelectric conversion region or peripheral circuit region. When an element becomes smaller, a margin in layout design also becomes smaller. If, therefore, the alignment accuracy of a contact hole for a diffusion region or gate electrode is low, penetration of an element isolation region may occur during etching for forming the contact hole. In this case, in operation of the photoelectric conversion device, an electric current may flow between a diffusion region in contact with a contact plug and a well in contact with the diffusion region.

To solve the above problem, a so-called self-aligned contact technique is well known. This technique prevents penetration of an element isolation region upon opening a contact hole by forming an insulating film having an etching stopper function capable of obtaining a selectivity ratio when forming, by etching, the contact hole for forming a contact plug. This technique is applied to a CMOS-type photoelectric conversion device with a small pixel size which requires a fine contact hole.

In a photoelectric conversion device disclosed in Japanese Patent Laid-Open No. 2004-228425, an etching stopper film is formed on a photoelectric converter in addition to an antireflection film. In this arrangement, the antireflection film and etching stopper film are stacked on a gate electrode for controlling transfer of charges accumulated in the photoelectric converter. This increases the thickness of a layer structure on the photoelectric converter, thereby decreasing the sensitivity and F-number proportionality.

SUMMARY OF THE INVENTION

The present invention provides a technique advantageous to decreasing the height of the layer structure of a photoelectric conversion device.

One of the aspects of the present invention provides a photoelectric conversion device including a pixel region having a photoelectric converter, and a transfer MOS transistor for transferring charges generated by the photoelectric converter to a floating diffusion, the device comprising: a first insulating film continuously arranged to cover the photoelectric converter, a first side surface of a gate electrode of the transfer MOS transistor, and a first region of an upper surface of the gate electrode while not arranged on a second region of the upper surface of the gate electrode, the first insulating film being configured to function as an antireflection film; a contact plug connected with the floating diffusion; and a second insulating film continuously arranged to cover a periphery of the contact plug on the floating diffusion, and the second side surface and the second region of the gate electrode while not arranged on the first region, the second insulating film being configured to function as an etching stopper in forming the contact plug.

Further features of the present invention will become apparent from the following description of exemplary embodiments with reference to the attached drawings.

BRIEF DESCRIPTION OF THE DRAWINGS

FIGS. 2A and 2B are sectional views showing the arrangement of a photoelectric conversion device according to the first embodiment;

FIGS. 3A and 3B are sectional views showing the arrangement of a photoelectric conversion device according to the second embodiment;

FIGS. 4A and 4B are sectional views showing the arrangement of a photoelectric conversion device according to the third embodiment; and FIGS. 5A and 5B are sectional views showing the arrangement of a photoelectric conversion device according to the fourth embodiment.

DESCRIPTION OF THE EMBODIMENTS

A photoelectric conversion device according to embodiments of the present invention includes a pixel region, which includes a photoelectric converter, and a transfer MOS transistor for transferring charges generated by the photoelectric converter to a floating diffusion. The pixel region can typically include a plurality of pixels that are one- or two-dimensionally arranged. Each pixel can include at least a photoelectric converter and a transfer MOS transistor. Each pixel can also include an amplifier MOS transistor for reading out a signal corresponding to charges transferred to a floating diffusion. The amplifier MOS transistor may be shared by a plurality of pixels. Furthermore, each pixel can include a reset MOS transistor for resetting the electric potential of a floating diffusion. The reset MOS transistor may also be shared by a plurality of pixels.

Figure 1A:
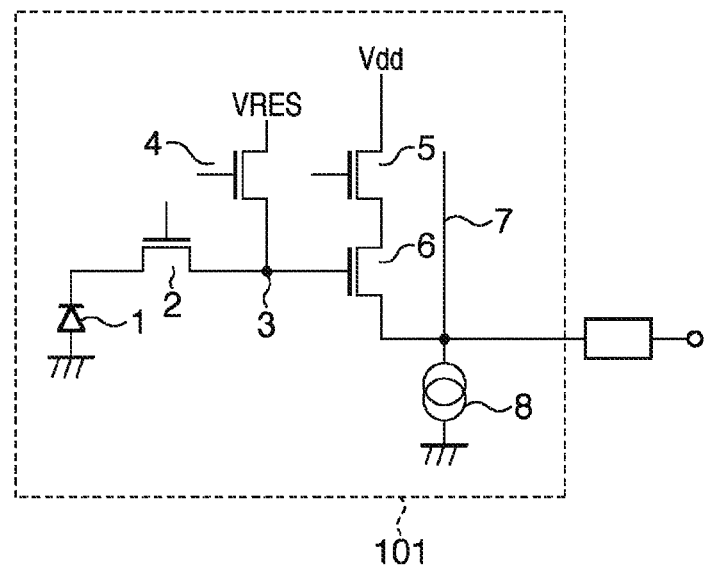
FIGS. 1A and 1B are views showing the arrangement of a photoelectric conversion device.

The arrangement of a pixel PIX of a photoelectric conversion device will be illustratively explained with reference to FIG. 1A. A pixel 101 includes at least a photoelectric converter 1 and a transfer MOS transistor 2. In the example shown in FIG. 1A, the pixel 101 also includes a reset MOS transistor 4 and an amplifier MOS transistor 6. The photoelectric converter 1 serves as, for example, a photodiode, which converts incident light into charges. The transfer MOS transistor 2 transfers the charges generated by the photoelectric converter 1 to a floating diffusion 3. Transferring the charges to the floating diffusion 3 changes the electric potential of the floating diffusion 3. The gate electrode of the amplifier MOS transistor 6 is electrically connected to the floating diffusion 3. The amplifier MOS transistor 6 outputs, to a signal line 7, a signal corresponding to a change in electric potential of the floating diffusion 3.

A source follower circuit can be formed, as an amplifier circuit, by a power supply (power supply line) Vdd, the amplifier MOS transistor 6, the signal line 7, and a constant current source 8. A selection MOS transistor 5 is arranged between the power supply line Vdd and the amplifier MOS transistor 6 or between the amplifier MOS transistor 6 and the signal line 7, and turned on to select the pixel 101 to which the selection MOS transistor 5 belongs. The selection MOS transistor 5 may be omitted, and the pixel may be selected by controlling the reset electric potential of the floating diffusion by the reset MOS transistor 4.

Figure 1B:
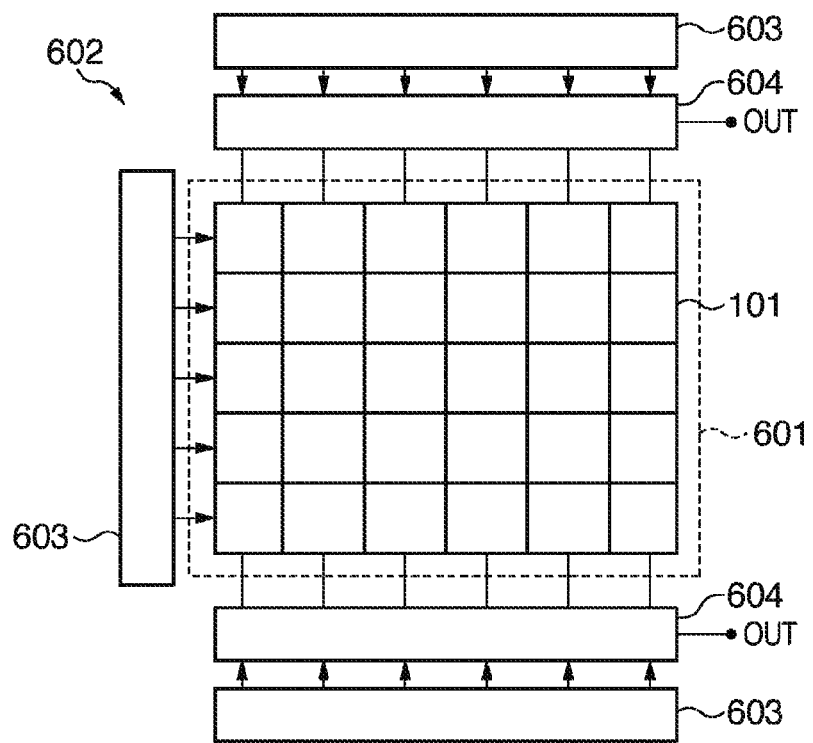

The arrangement of the photoelectric conversion device will be illustratively described with reference to FIG. 1B. The photoelectric conversion device includes a pixel region 601 having at least one pixel 101, and a peripheral circuit region 602. Typically, a plurality of pixels 101 can be arranged in the pixel region 601. The peripheral circuit region 602 is a region other than the pixel region 601. The peripheral circuit region 602 can include a scanning circuit 603 for selecting a pixel 101 in the pixel region 601 to transfer a signal, and a processing circuit (readout circuit) 604 for processing the signal output from the selected pixel 101.

FIGS. 2A and 2B are sectional views showing the arrangement of a photoelectric conversion device according to the first embodiment. FIG. 2A is a sectional view showing part of the pixel 101 of the pixel region 601. FIG. 2B is a sectional view showing part of the peripheral circuit region 602. Reference numeral 31 denotes a gate electrode of the transfer MOS transistor 2; 32, a gate electrode of the reset MOS transistor 4; 30, a gate insulating film for the MOS transistors; and 33, a semiconductor region of the first conductivity type forming one semiconductor region of the photoelectric converter 1. Note that the first conductivity type has, as a majority carrier, charges serving as a signal, and is n-type if the charges serving as a signal are electrons. On the contrary, if the charges serving as a signal are positive holes, the first conductivity type is p-type. This embodiment is explained on the assumption that the first conductivity type is n-type.

Reference numeral 39 denotes a well, which is a semiconductor region of the second conductivity type opposite to the first conductivity type; 38, a semiconductor substrate; and 35, a semiconductor region of the second conductivity type for making the semiconductor region 33 of the first conductivity type forming one semiconductor region of the photoelectric converter 1 having a buried structure. The floating diffusion 3 is formed in the well 39. Reference numeral 34 denotes a semiconductor region of the first conductivity type applied with a reset electric potential, which functions as the drain (impurity diffusion region) of the reset MOS transistor 4.

Reference numeral 45 denotes an element isolation film (silicon oxide). An element isolation method includes the LOCOS, STI, and mesa-type methods, and any of them may be employed. Diffusion isolation may be used as an element isolation method. Reference numeral 36a denotes silicon nitride; and 37a, silicon oxide covering the silicon nitride 36a. A combination of the silicon nitride 36a and the silicon oxide 37a has an effect of reducing reflection on the surface of the photoelectric converter 1. On a second side surface SS2 of the gate electrode 31, the silicon nitride 36a and the silicon oxide 37a form a side spacer in contact with the second side surface SS2 of the gate electrode 31. For example, it is possible to set the film thickness of the silicon nitride 36a to be 15 to 85 nm, and the film thickness of the silicon oxide 37a to be 250 nm or smaller. A first insulating film 10 formed by the silicon nitride 36a and the silicon oxide 37a is continuously arranged to cover the photoelectric converter 1, a first side surface SS1 of the gate electrode 31 of the transfer MOS transistor 2, and a first region US1 on the upper surface of the gate electrode 31 of the transfer MOS transistor 2. Note that the first insulating film 10 is not limited to the combination of the silicon nitride 36a and the silicon oxide 37a, and may be formed by, for example, a single layer of silicon nitride. A gate insulating film 30b where the gate insulating film 30 extends is provided under the first insulating film 10.

The source of the transfer MOS transistor 2 is common with the semiconductor region 33 forming one semiconductor region of the photoelectric converter 1. The floating diffusion 3 also serves as the drain of the transfer MOS transistor 2 or the source of the reset MOS transistor 4. The floating diffusion 3 is connected to the gate electrode of the amplifier MOS transistor 6 via a contact plug 41a1. Also, the semiconductor region 34 is connected to a reset voltage line VRES (not shown) via a contact plug 41a2.

FIG. 2B shows the arrangement of at least one of a plurality of MOS transistors of the peripheral circuit region 602. Reference numeral 42 denotes a gate electrode of a MOS transistor of the peripheral circuit region 602; 43, semiconductor regions (impurity diffusion regions) of the first conductivity type with a high impurity concentration, which respectively serve as a source and a drain; and 44, semiconductor regions of the first conductivity type with a low impurity concentration, which is lower than that of the semiconductor regions 43, for providing an LDD structure. Silicon nitride 36b and silicon oxide 37b form a side spacer in contact with the side surface of the gate electrode 42.

The silicon nitrides 36a and 36b are deposited with the same material in the same deposition step. The silicon oxides 37a and 37b are deposited with the same material in the same deposition step. In this case, it is possible to determine the materials and thicknesses of the silicon nitrides 36a and 36b and the silicon oxides 37a and 37b so that both an appropriate size of the side spacer in contact with the gate electrode of the MOS transistor and an antireflection effect on the photoelectric converter 1 are obtained. In this example, the silicon nitrides 36a and 36b and the silicon oxides 37a and 37b are used. The first insulating film 10, however, may be formed by a single layer of silicon nitride.

The reset MOS transistor 4 of the pixel region 601 exemplified in FIG. 2A has the LDD structure like the MOS transistor of the peripheral circuit region 602. That is, the floating diffusion 3 includes a semiconductor region (n−) with a low impurity concentration for providing the LDD structure. Although not shown in FIG. 2A, MOS transistors other than the reset MOS transistor 4 of the pixel 101, for example, the amplifier MOS transistor and selection MOS transistor, may have the LDD structure. In the first embodiment, it is possible to simultaneously form the silicon nitrides 36a and 36b. It is also possible to simultaneously form the silicon oxides 37a and 37b. This offers an advantage of reducing a manufacturing cost.

The first insulating film 10 is present on the photoelectric converter 1 in dry etching for forming a side spacer. This has the effect of protecting the photoelectric converter 1 from damage caused by etching. To protect the photoelectric converter 1, it is desirable to design the first insulating film 10 to be formed on the photoelectric converter 1 even when a misalignment occurs in forming a pattern. To do this, the first insulating film 10 covers the first side surface SS1 and the first region US1 to ride over part (first region) of the upper surface of the gate electrode 31 of the transfer MOS transistor 2. The first insulating film 10 may partially ride over the element isolation film.

It is possible to use the first insulating film 10 (36a and 37a) on the photoelectric converter 1 as a mask for forming, by ion implantation, the impurity diffusion regions (high impurity concentration regions) 43 of the MOS transistor of the peripheral circuit region 602, the impurity diffusion region 34 of the reset MOS transistor 4 of the pixel 101, and the floating diffusion 3.

Reference numeral 11 denotes a second insulating film which functions as an etching stopper in anisotropic dry etching for forming, in an interlayer insulating film 40, contact holes for forming the contact plugs 41a1 and 41a2 and a contact plug 41b. The second insulating film 11 can be, for example, silicon nitride. A resist pattern of the contact holes for forming the contact plugs may enter the region of the element isolation film 45 due to a misalignment. Since there exists the second insulating film 11 with a high etching selectivity ratio with respect to the interlayer insulating film 40, the bottoms of the contact holes (contact plugs) do not contact with the well 39 on the bottom and side surface of the element isolation film 45 when etching the interlayer insulating film 40. It is, therefore, possible to suppress flow of an electric current between the well 39 and an impurity diffusion region (source or drain) of the MOS transistor in operation. This effect is as described in Japanese Patent Laid-Open No. 2004-228425. Similarly, it is possible to suppress penetration due to a misalignment of the contact holes for forming the contact plugs designed to be connected with the gate electrodes. As described above, it is possible to implement, using the second insulating film 11, a layout in which a cover margin between a contact plug and a diffusion layer or between a contact plug and a gate electrode is small, thereby achieving a fine pixel structure.

The first insulating film 10 is not arranged on a second region US2 of the upper surface of the gate electrode 31 of the transfer MOS transistor 2. The second insulating film 11 is continuously arranged to cover the periphery of the contact plug 41a1 on the floating diffusion 3, and the second side surface SS2 and the second region US2 of the gate electrode 31, but not arranged on the first region US1. That is, the first insulating film 10 and the second insulating film 11 do not overlap each other on the gate electrode 31 of the transfer MOS transistor 2. In other words, the upper surface of the first insulating film 10 on the gate electrode 31 of the transfer MOS transistor 2 is in contact with the interlayer insulating film 40 where the contact plugs are formed. In another expression, of the upper surface of the gate electrode, the first insulating film is arranged only on the first region, and of the upper surface of the gate electrode, the second insulating film is arranged only on the second region that is different from the first region. With such structure, it is possible to decrease the step of the photoelectric conversion device as compared with the arrangement in which the first insulating film 10 and the second insulating film 11 overlap each other on the gate electrode 31, thereby improving the sensitivity and F-number proportionality. The first side surface SS1 of the gate electrode 31 of the transfer MOS transistor serves as a side surface, on the photoelectric converter 1 side, of the gate electrode of the transfer MOS transistor. The second side surface SS2 of the gate electrode 31 of the transfer MOS transistor serves as a side surface, on the floating diffusion 3 side, of the gate electrode of the transfer MOS transistor. The first region US1 of the upper surface of the gate electrode 31 is a region on the photoelectric converter 1 side on the upper surface of the gate electrode 31 as compared with the second region US2.

The interlayer insulating film 40 is formed on the second insulating film 11. The interlayer insulating film 40 can be, for example, an NSG film, BPSG film, or HDP-SiO film but may be another film. The surface of the interlayer insulating film 40 is planarized using a planarization method such as a CMP process. A polishing amount in the CMP process (a decrease in film thickness due to the CMP process) depends on the step of the surface of the interlayer insulating film 40 before the CMP process. With an increase in step, the polishing amount becomes larger. If the polishing amount becomes larger, in-plane variation in polishing amount accordingly increases. The thickness of the interlayer insulating film 40 after the CMP process is set to a thickness enough for stable management in consideration of in-plane variation in polishing amount. Consequently, as the step immediately before the CMP process is smaller, a thinner interlayer insulating film 40 can be obtained after the CMP process. In the pixel 101, the level, from the well 39 or semiconductor substrate, of a region where the gate electrode of a MOS transistor such as the transfer MOS transistor 2 is arranged is higher than that of a region where the photoelectric converter 1 is arranged, by the thickness of the gate electrode. It is, therefore, possible to form a thin interlayer insulating film 40 by employing a structure in which the first insulating film 10 and the second insulating film 11 do not overlap each other on the gate electrode 31 of a MOS transistor, especially the transfer MOS transistor 2. This can improve the sensitivity and F-number proportionality. As described above, it is desirable that the first insulating film 10 serving as an antireflection film rides over part (the first region US1) of the gate electrode 31 of the transfer MOS transistor 2 as a MOS transistor inevitably adjacent to the photoelectric converter 1. The transfer MOS transistor 2 has, as one main electrode (impurity diffusion region), the floating diffusion 3 connected with the contact plug 41a1. The second insulating film 11 functioning as an etching stopper is continuously arranged to cover the periphery of the contact plug 41a1 on the floating diffusion 3, and the second side surface SS2 and the second region US2 of the gate electrode 31. This is because a resist pattern of contact holes for forming contact plugs may be arranged on a portion except for the floating diffusion 3 due to a misalignment. That is, both the first insulating film 10 and the second insulating film 11 ride over the gate electrode 31 but they do not overlap each other on the gate electrode 31. This offers an advantage of decreasing the thickness of the interlayer insulating film 40, that is, the thickness of the structure on the photoelectric converter 1.

In this embodiment, CMP is exemplified as a planarization method. It is, however, possible to obtain the same effect even if another planarization method is adopted. Although not shown, if there is a portion where the gate electrode 31 rides over the element isolation film 45, and the first insulating film 10 exists thereon, a greater effect is expected. The present invention, however, is not limited to such arrangement.

In FIGS. 2A and 2B, structures such as a wiring layer, color filter, and micro-lens are omitted. However, the photoelectric conversion device naturally has a wiring layer, and may include a color filter and/or micro-lens.

FIGS. 3A and 3B are sectional views showing the arrangement of a photoelectric conversion device according to the second embodiment. FIG. 3A is a sectional view showing part of a pixel 101 of a pixel region 601. FIG. 3B is a sectional view showing part of a peripheral circuit region 602. Details not specifically mentioned here conform to the first embodiment. In the second embodiment, in addition to an arrangement that a first insulating film 10 and a second insulating film 11 do not overlap each other on a gate electrode 31 of a transfer MOS transistor 2, the first insulating film 10 and the second insulating film 11 do not overlap each other on a photoelectric converter 1. For example, the first insulating film 10 can have a stacked structure including silicon nitride 36a and silicon oxide 37a, and the second insulating film 11 can be formed by a single layer of silicon nitride. In terms of the antireflection effect of the photoelectric converter 1, if the second insulating film 11 has a refractive index different from that of the silicon oxide 37a, a reflectance on the interface between the second insulating film 11 and the silicon oxide 37a may rise, thereby decreasing the antireflection effect. In the second embodiment, it is possible to suppress a decrease in antireflection effect with an arrangement in which the second insulating film 11 of the photoelectric converter 1 is not formed.

FIGS. 4A and 4B are sectional views showing the arrangement of a photoelectric conversion device according to the third embodiment. FIG. 4A is a sectional view showing part of a pixel 101 of a pixel region 601. FIG. 4B is a sectional view showing part of a peripheral circuit region 602. Details not specifically mentioned here conform to the first or second embodiment. In the third embodiment, the impurity diffusion regions (more specifically, a floating diffusion 3, an impurity diffusion region (semiconductor region 34) of a reset MOS transistor 4, and impurity diffusion regions of other MOS transistors) of MOS transistors arranged in the pixel region 601 including the pixel 101 have an impurity concentration lower than that of impurity diffusion regions 43 of a MOS transistor with an LDD structure arranged in the peripheral circuit region 602. Namely, the impurity diffusion regions of the MOS transistors arranged in the pixel region 601 can be constituted by only a semiconductor region (n−) having a low impurity concentration and an impurity region for connecting to the contact plug. With this structure, it is possible to suppress characteristic deterioration due to hot carriers in MOS transistors 2, 4, 5, and 6 arranged in the pixel region 601 including the pixel 101, and to improve the driving capability of the MOS transistor arranged in the peripheral circuit region 602.

In the third embodiment, in the pixel region 601 including the pixel 101, silicon nitride 36a covers a region except for contact plugs such as contact plugs (first contact plugs) 41a1 and 41a2. In the pixel region 601, the silicon nitride 36a functions as an etching stopper for self-aligned contacts. In the pixel region 601, a second insulating film 11 is arranged on the first insulating film 10, and can be used to prevent a contact plug such as the contact plug 41a2 from being formed on the region of an element isolation film 45.

At least one of a plurality of MOS transistors arranged in the peripheral circuit region 602 has an LDD structure. In the peripheral circuit region 602, silicon nitride 36b remains as part of a side spacer in contact with the side surface of a gate electrode 42 of the MOS transistor but separates from a contact plug (second contact plug) 41b. The contact plug 41b can be formed by a self-aligned contact technique. That is, it is possible to use, as an etching stopper, the second insulating film 11 covering the side spacer formed by the silicon nitride 36b and the silicon oxide 37b when etching a contact hole for forming the contact plug 41b. In a region where a photoelectric converter 1 is arranged, the second insulating film 11 is arranged on the first insulating film 10 when the antireflection effect increases.

Also in the third embodiment, the first insulating film 10 and second insulating film 11 are arranged so that they do not overlap each other on a gate electrode 31 of the transfer MOS transistor 2, thereby trying to improve the sensitivity and F-number proportionality.

FIGS. 5A and 5B are sectional views showing the arrangement of a photoelectric conversion device according to the fourth embodiment. FIG. 5A is a sectional view showing part of a pixel 101 of a pixel region 601. FIG. 5B is a sectional view showing part of a peripheral circuit region 602. Details not specifically mentioned here conform to the first to third embodiments. In the fourth embodiment, a gate electrode 42 and impurity diffusion regions 43 of at least one (a MOS transistor required to be faster) of a plurality of MOS transistors of the peripheral circuit region 602 have a salicide structure including metal silicide layers 42a and 43a, respectively. The metal silicide layer 42a or 43a is formed by a silicon compound of a high melting point metal. Using a salicide structure in the pixel region 601 may increase the leakage current of a photoelectric converter 1, thereby causing a white flaw and a dark current. The pixel region 601, therefore, does not adopt a salicide structure.

The metal silicide layer 42a or 43a can contain, for example, titanium silicide, nickel silicide, cobalt silicide, tungsten silicide, molybdenum silicide, tantalum silicide, chromium silicide, palladium silicide, or platinum silicide. A protection film 12 for preventing silicidation is formed in a region where no silicide layer is to be formed. In a region where a first insulating film 10 is formed, since formation of a metal silicide layer is suppressed, it is unnecessary to form the protection film 12. It is thus possible to form the protection film 12 to cover the periphery of contact plugs in impurity diffusion regions (for example, a floating diffusion 3 and semiconductor region 34), and a second side surface SS2 and a second region US2 of the upper surface of a gate electrode 31 of a transfer MOS transistor 2. Since a silicide layer may be formed if the pixel 101 includes a region where neither of the first insulating film 10 and the protection film 12 exist, the first insulating film 10 and the protection film 12 preferably overlap each other. Note that the protection film 12 is formed by forming an insulating film serving as the protection film 12 before forming a second insulating film 11, and removing a portion where contact holes are formed.

Also in the fourth embodiment, the first insulating film 10 and second insulating film 11 are arranged so that they do not overlap each other on the gate electrode 31 of the transfer MOS transistor 2, thereby improving the sensitivity and F-number proportionality.

In the fourth embodiment, the first insulating film 10 with the antireflection effect has a stacked structure including silicon nitride 36a and silicon oxide 37a, but may be formed by, for example, a single layer of silicon nitride. If, for example, a single layer of silicon nitride 36a forms the first insulating film 10, and is used as a protection film for silicidation, the thickness of the silicon nitride 36a may decrease by etching or the like when forming a metal silicide layer. By controlling a decrease in thickness of the silicon nitride 36a, silicon nitride may be used to form the second insulating film 11, and a stacked structure including the silicon nitride 36a and the second insulating film (in this case, silicon nitride) 11 may form an antireflection film.

As an application example of the photoelectric conversion device according to each of the above-described embodiments, a camera incorporating the photoelectric conversion device will be illustratively explained below. A camera conceptually includes not only a device whose principal purpose is photographing but also a device (for example, a personal computer or portable terminal) additionally provided with a photographing function. A camera includes the photoelectric conversion device according to the present invention, which has been exemplified in the above embodiments, and a processing unit for processing a signal output from the photoelectric conversion device. The processing unit can include, for example, an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-114706, filed May 18, 2010, which is hereby incorporated by reference herein in its entirety.

What is claimed is:

1. A photoelectric conversion device including a pixel region, the device comprising:
   a photoelectric converter arranged in the pixel region;
   a transfer MOS transistor arranged in the pixel region for transferring charges generated by the photoelectric converter to a floating diffusion;
   a first film continuously arranged to cover the photoelectric converter and a first region of an upper surface of a gate electrode of the transfer MOS transistor, the first film being an insulating film;
   a second film continuously arranged to cover the floating diffusion and a second region of the gate electrode of the transfer MOS transistor, the second film being an insulating film; and
   a contact plug connected with the floating diffusion through the second film,
   wherein the first film and the second film do not overlap each other on the upper surface of the gate electrode of the transfer MOS transistor.

2. The device according to claim 1, further comprising:
   a side spacer formed by the same material as that of the first film arranged on a side surface of the gate electrode of the transfer MOS transistor.

3. The device according to claim 1, further comprising:
   a plurality of MOS transistors arranged in a peripheral circuit region other than the pixel region, the plurality of MOS transistors including a peripheral MOS transistor,
   wherein a side spacer, formed by the same material as that of the first film, is arranged on a side surface of a gate electrode of the peripheral MOS transistor, and the first film has a stacked structure.

4. The device according to claim 1, wherein the first film is formed by silicon nitride, and the second film is formed by silicon nitride.

5. The device according to claim 1, wherein the second film covers the photoelectric converter so that the first film is positioned between the second film and the photoelectric converter.

6. The device according to claim 1, wherein the second film does not cover the photoelectric converter.

7. The device according to claim 3, wherein the gate electrode of the peripheral MOS transistor and impurity diffusion regions of the peripheral MOS transistors include metal silicide layers, respectively, and
   wherein a third film covers the second region and the floating diffusion so that the third film is positioned between the second film and the second region, and the third film is not arranged on the gate electrode of the peripheral MOS transistor and impurity diffusion regions of the peripheral MOS transistor.

8. The device according to claim 7, wherein the first film and the third film overlap each other.

9. A photoelectric conversion device including a pixel region and a peripheral circuit region, the device comprising:
   a photoelectric converter arranged in the pixel region;
   a transfer MOS transistor arranged in the pixel region for transferring charges generated by the photoelectric converter to a floating diffusion;
   a plurality of MOS transistors arranged in the peripheral circuit region, the plurality of MOS transistors including a peripheral MOS transistor;
   a first insulating film covering the floating diffusion, the photoelectric converter, and a gate electrode of the transfer MOS transistor;
   a first contact plug connected with the floating diffusion through the first insulating film;
   a second contact plug connected with an impurity diffusion region of the peripheral MOS transistor; and
   a second insulating film covering the impurity diffusion region and the gate electrode of the peripheral MOS transistor,
   wherein the second contact plug is connected with the impurity diffusion region through the second insulating film, and
   wherein the second insulating film is not arranged on the gate electrode of the transfer MOS transistor.

10. The device according to claim 9, further comprising:
    a side spacer formed by the same material as that of the first insulating film, arranged on a side surface of the gate electrode of the peripheral MOS transistor,
    wherein the first insulating film has a stacked structure.

11. The device according to claim 9, wherein the first insulating film is formed by silicon nitride and the second insulating film is formed by silicon nitride.

12. A camera comprising:
    a photoelectric conversion device according to claim 1; and
    a processing unit configured to process a signal output from the photoelectric conversion device.

13. A camera comprising:
    a photoelectric conversion device according to claim 9; and
    a processing unit configured to process a signal output from the photoelectric conversion device.

14. A photoelectric conversion device including a pixel region and a peripheral circuit region, the device comprising:
    a photoelectric converter arranged in the pixel region;
    a transfer MOS transistor arranged in the pixel region for transferring charges generated by the photoelectric converter to a floating diffusion;
    a reset MOS transistor arranged in the pixel region for resetting an electric potential of the floating diffusion;
    a plurality of MOS transistors arranged in the peripheral circuit region, the plurality of MOS transistors including a peripheral MOS transistor;
    a first insulating film covering the photoelectric converter, a gate electrode of the transfer MOS transistor, the floating diffusion, a gate electrode of the reset MOS transistor, and a semiconductor region of the reset MOS transistor;
    a first contact plug connected with the semiconductor region of the reset MOS transistor through the first insulating film;
    a second insulating film covering an impurity diffusion region of the peripheral MOS transistor and a gate electrode of the peripheral MOS transistor; and
    a second contact plug connected with the impurity diffusion region of the peripheral MOS transistor through the second insulating film,
    wherein the second insulating film is not arranged on the gate electrode of the reset MOS transistor.

15. The device according to claim 14, wherein a side spacer formed by the same material as that of the first insulating film is arranged on a side surface of the gate electrode of the peripheral MOS transistor.

16. The device according to claim 15, wherein the first insulating film has a stacked structure including silicon nitride and silicon oxide.

17. The device according to claim 14, wherein the first insulating film and the second insulating film is formed by silicon nitride.

18. The device according to claim 14, wherein a third insulating film formed by the same material as that of the second insulating film covers the photoelectric converter so that the first insulating film is positioned between the third insulating film and the photoelectric converter.

19. The device according to claim 14, wherein the third insulating film is not arranged on the floating diffusion.

20. A camera comprising:
   a photoelectric conversion device according to claim 14; and
   a processing unit configured to process a signal output from the photoelectric conversion device.

* * * * *